United States Patent
Wu

(10) Patent No.: US 9,378,315 B1
(45) Date of Patent: Jun. 28, 2016

(54) METHOD FOR SEMICONDUCTOR PROCESS CORNER SWEEP SIMULATION BASED ON VALUE SELECTION FUNCTION

(71) Applicants: EXCELIO TECHNOLOGY (SHENZHEN) CO., LTD., Shenzhen, Guangdong Province (CN); WUXI EXCELIO TECHNOLOGY CO., LTD., Wuxi, Jiangsu Province (CN)

(72) Inventor: Patrick Bian Wu, Shenzhen (CN)

( * ) Notice: Subject to any disclaimer, the term of this patent is extended or adjusted under 35 U.S.C. 154(b) by 22 days.

(21) Appl. No.: 14/567,733

(22) Filed: Dec. 11, 2014

(51) Int. Cl.
*G06F 17/50* (2006.01)

(52) U.S. Cl.
CPC ........ *G06F 17/5036* (2013.01); *G06F 17/5045* (2013.01)

(58) Field of Classification Search
CPC ............ G06F 17/5081; G06F 17/5009; G06G 2217/12
USPC .......................................................... 716/106
See application file for complete search history.

(56) References Cited

U.S. PATENT DOCUMENTS

| | | | | |
|---|---|---|---|---|
| 8,037,433 B2 * | 10/2011 | Chidambarrao | .... | G06F 17/5081 716/100 |
| 8,370,774 B2 * | 2/2013 | Tsai | .................... | G06F 17/5009 703/14 |
| 8,560,294 B1 * | 10/2013 | Ren | ...................... | G06F 17/5036 703/14 |
| 8,799,830 B2 * | 8/2014 | Robles | ................ | G06F 17/5022 716/111 |
| 9,129,082 B2 * | 9/2015 | Chang | .................. | G06F 17/5081 |
| 9,171,125 B2 * | 10/2015 | Arsovski | ............. | G06F 17/5081 |

* cited by examiner

*Primary Examiner* — Sun Lin
(74) *Attorney, Agent, or Firm* — Wayne & King LLC

(57) ABSTRACT

The present invention relates to a field of semiconductor design technologies. The present invention implements a sweep simulation method in which process corners are continuously swept in a simulation job, and a process corner a field is used as an independent variable, so that a simulation program outputs a waveform chart using the parameter values of the device model under various process corner conditions or performance response values of a testbench circuit under various process corner conditions as dependent variables. Thereby, parameter deviations of the device model and performance deviations of the testbench circuit under various process corner conditions are presented in a same coordinate system, and visual technical references are provided for a designer, and process deviations are properly taken into account in a circuit design, and possible fatal defects of the circuit design caused by a process deviation impact are avoided, and a processing procedure of the simulation program is greatly simplified, and efficiency of research and development of the designer is improved.

4 Claims, 2 Drawing Sheets

METHOD FOR SEMICONDUCTOR PROCESS CORNER SWEEP SIMULATION BASED ON VALUE SELECTION FUNCTION

TECHNICAL FIELD

The present invention relates to the field of semiconductor design technologies, and in particular, to a method for dynamically determining the values of semiconductor device model parameters under process corner conditions by using a value selection function as a tool, so as to perform sweep simulation on performance responses of a semiconductor integrated circuit chip and parameter values of an integrated circuit device model that vary with process corners.

BACKGROUND

The simulation of a semiconductor chip is an effort to calculate, predict, and verify the functionality and performance of a semiconductor integrated circuit chip produced in an integrated manufacturing process using various mathematical models on a computer. In particular, designing an analog integrated circuit of a semiconductor chip mainly involves calculating, predicting, and verifying the functionality and performance of the analog circuit, which deals with continuously changing quantities such as charges, voltages, and currents on a continuous time axis.

The calculation, prediction, and verification of the functionality and performance of the analog circuit are performed on a computer simulation platform. The simulation platform includes several basic elements: a simulation test circuit (Testbench), a simulation software tool (Simulator), and a process model (Model).

The simulation test circuit is a test circuit that is set up by a circuit designer according to a performance simulation requirement, and is made up of a device under test (Device Under Test, DUT), a stimulus circuit (Stimulus), and a related signal processing circuit.

Analog circuit simulation software tools are mainly provided by electronic design automation (Electronic Design Automation, EDA) tool vendors. The typical commercial software tools are Spectre from Cadence U.S.A, Eldo from Mentor Graphics U.S.A, and Hspice from Synopsys U.S.A, etc.

Process models are mainly provided by the major semiconductor line manufacturers in the form of Spice-type device models that are interpretable to simulators. Under the globally prevalent fabless chip design business model, chip is mainly fabricated by a few wafer production line foundries in the world, for example, TSMC (Taiwan Semiconductor Manufacturing Co., Ltd.), SMIC (Semiconductor Manufacturer International Corporation Co., Ltd.), UMC (United Microelectronics Corporation), and GlobalFoundries, etc. A process model mainly consists of a set of parameterized semiconductor device mathematical models. The parameterized mathematical models simulate physical response characteristics of a semiconductor device itself under an input parameter condition, for example, with respect to a MOS transistor, how much current will pass through a MOS transistor of a certain channel size when a bias voltage of each electrode is set to a state.

Specifically, when performing simulation, a designer needs to first choose a process model on the simulation platform, for example, to select a suitable device model within the process. For an analog integrated circuit, it is not only necessary to care about a performance response of the integrated circuit under a typical process condition, but also necessary to pay attention from a perspective of statistics, to the performance responses and their statistical distribution under extreme circumstances of fluctuations of process, that is, yield. A common practice in the industry is that when foundries develop process models of their semiconductor production process, the process models are grouped into several process corners according to various extreme conditions. For example, the models of conventional complementary metal-oxide-semiconductor processes, namely, CMOS processes, are grouped as typical process (typical), fast-NMOS fast-PMOS process (fast-N fast-P), slow-NMOS slow-PMOS process (slow-N slow-P), fast-NMOS slow-PMOS process (fast-N slow-P), and slow-NMOS fast-PMOS process (slow-N fast-P). Each of the latter four corresponds, respectively, to the extreme cases of device model parameter fluctuation caused by the doping fluctuations of N-type impurities and P-type impurities. Therefore, when choosing simulation models, the designer needs to respectively choose the parameter values corresponding to process corners. Up to now, a general practice in the industry is that every time when a process corner is replaced, it is necessary to manually configure the model setting to a parameter set of each process corner in a design tool before a simulation can be performed. Thus, simulations can be performed for different process corners respectively. A problem of this practice is low efficiency. Simulating across different process corners is very time- and energy-consuming, which affects the progress of product development.

In addition, the foregoing simulation method is to perform calculation on each of the performance specifications to be verified under each process corner condition, and to obtain a waveform chart where the independent variables defined in the simulation setting (for example, temperature, time, and current) are used as horizontal coordinate axis, and the dependent variables (for example, impedance, gain, bandwidth, and noise) of circuit performance responses selected in the simulation setting are used as vertical coordinate axis. Since the waveform charts obtained under various process corner conditions are different from one another, in order to compare and analyze the differences of a dependent variable value under various process corner conditions, it is necessary to superpose the response waveform charts of the same dependent variable into one coordinate system, and select the data points on the waveforms of the same dependent variable under different process corner conditions and corresponding to the same value of the same independent variable, and then set up a coordinate system where the process corners are used as horizontal coordinate axis and the response values of the dependent variable are used as vertical coordinate axis, and plot the data points in the coordinate system for the response values of the dependent variable under various process corner conditions respectively, thereby obtaining a curve chart of the selected dependent variable that varies with process corners.

The foregoing method of data consolidation, processing, and analysis is not only time-consuming, but also requires large memory support, therefore, is always a bottleneck in design progress, and thus becomes a defect in design methodology.

A scripting language, OCEAN, which is capable of invoking and controlling a simulator (for example, Spectre) is provided in an analog integrated circuit simulation software tool from Cadence. OCEAN provides a simple easy-to-use script environment interfacing between a simulator and a design task. For example, in an OCEAN script file, a simulator, a simulation data storage path, a simulation model file name, simulation analysis and circuit design variables, etc. are set in sequence, and a simulation job may be started directly by running this OCEAN file. A loop statement of OCEAN may be used to sequentially set up and replace device model files required by each process corner for each iteration, so that the performance responses of the circuit of different process corners are simulated.

The OCEAN script in essence is to sequentially start different simulation jobs; each of the jobs individually performs simulation of each process corner. The generated data must be respectively stored in different file paths; otherwise, the data of the previously simulation runs are overwritten. Because simulation can be automatically started, this method may be used to improve design efficiency. However, because simulation of each process corner is still not completed in a same simulation job, an objective of drawing response values of a dependent variable in one waveform chart using process corners as the horizontal coordinates is not achieved.

As a leading EDA solution provider in the industry, Cadence provides an analog integrated circuit simulation platform, Virtuoso, which provides an Analog Artist simulation environment with a graphical interface. In this graphical interface, different process corners are arranged in the form of user-defined design variables in a table along with other design variables. Process corner files provided by a foundry may also be combined with other design variables of extreme values into new process corners. Although this method seems to be implemented in a different manner from the OCEAN script technology, it in essence is still merely to solve the problem of automatically starting simulation of each process corner. However, parameter values of each process corner cannot be automatically taken into a parameter-sweeping style simulation job, that is, a waveform of the performance response values of a dependent variable cannot be obtained in a same coordinate system with process corner as an independent variable.

Using different script technologies to link simulation jobs that otherwise run one-by-one has become a practice for improving simulation efficiency in the industry. Up to now, all these script technologies only solve this problem from a perspective of automatically starting simulation jobs. Indeed, automatically starting simulation jobs by means of coordinating, and waiting to hand-shake between jobs, etc. still cannot ultimately solve the problem of continuously sweeping process corners in a simulation job. Only by sweeping each process corner within one simulation job, can a much desired waveform of performance responses of a dependent variable with respect to process corners be drawn along a horizontal axis in the same graph where process corners are used as an independent variable.

SUMMARY

An objective of the present invention is to overcome disadvantages of low speed and low efficiency of the conventional semiconductor process corner simulation method, and provide a method for semiconductor process corner sweep simulation based on a value selection function, to sweep different process corners in a same simulation job and draw a curve directly using the process corners as independent variables according to the generated data.

To achieve the foregoing objective, the present invention adopts the following technical solution:

A method for semiconductor process corner sweep simulation based on a value selection function includes the following steps:

(1) defining a value selection function, where in the value selection function, a natural number enumerating a process corner is used as a first independent variable, parameter values of a device model of a semiconductor process manufacturer line under the enumerated process corner condition are used as the rest of independent variables, and the parameter values of the device model of the semiconductor process manufacturer line under the enumerated process corner conditions are the values to be returned, that is, parameter value of the device model=$f$(corner_number,parameter-value #1,parameter-value #2, ... ,parameter-value #$n$), where, the function "f" on the right side of the equation is the value selection function, and a return value of the value selection function, upon a selection operation performed according to a value of the first independent variable, is obtained and assigned to a device model parameter on the left side of the equation via an equal sign;

(2) setting up the first independent variable in the value selection function, namely, corner_number, as a user-defined design variable, in a sweep simulation program, run the simulation program while sweeping the values of corner_number in simulation one by one; and (3) outputting a waveform chart from the simulation results using corner_number as an independent variable and using a parameter value of the device model under the process corner condition or a performance response value of a testbench circuit under the process corner condition as a dependent variable.

In the present invention, a process corner may be used as an independent variable, so that a simulation program outputs a waveform chart using parameter values of a device model under various process corner conditions or performance response values of a testbench circuit under various process corner conditions as a dependent variable. Thereby, performance response deviations of the device model or those of the testbench circuit under various process corner conditions are presented in a same coordinate system, visual technical references are provided for the designer, the data processing procedure of a simulation program is greatly simplified, and the efficiency of circuit design is improved.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF THE PREFERRED EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
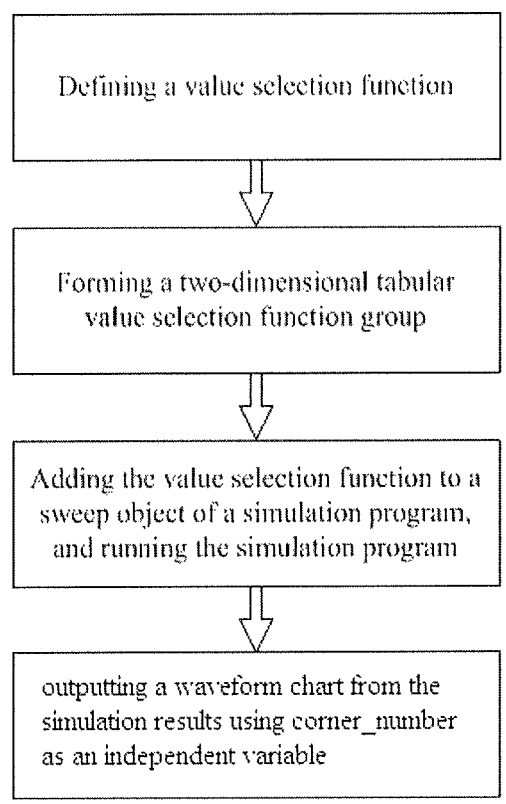
FIG. 1 is a flowchart of an implementation manner of a method for semiconductor process corner sweep simulation based on a value selection function according to the present invention.

The present invention provides a method for semiconductor process corner sweep simulation based on a value selection function. As shown in FIG. 1, the method includes the following steps:

(1) defining a value selection function, where a natural number enumerating a process corner is used as a first independent variable, the parameter values of a device model of a semiconductor process manufacturer line under the enumerated process corner conditions are used as the rest of independent variables, and the parameter values of the device model of the semiconductor process manufacturer line under the enumerated process corner conditions are function values to be returned, that is, parameter value of the device model=$f$(corner_number,parameter-value #1,parameter-value #2, . . . ,parameter-value #$n$), where, a function "f" on the right side of the equation is the value selection function, and the return value of the value selection function, upon a selection operation is performed according to the value of the first independent variable, is obtained and assigned to a device model parameter on the left side of the equation via an equal sign;

(2) setting up the first independent variable in the value selection function, namely, corner_number, as a user-defined design variable, in a sweep simulation program, and run the simulation program while sweeping the values of corner_number in simulation one by one; and (3) outputting a waveform chart from the simulation results using corner_number as an independent variable and a parameter value of the device model under the process corner condition or a performance response value of a testbench circuit under the process corner condition as a dependent variable.

The value selection function uses natural numbers to represent and enumerate the process corners as the first independent variable, and uses parameter values of the device model of the semiconductor process manufacturer line under the enumerated process corner conditions as the rest of the independent variables. In the present invention, five different process corners of conventional processes, namely, a typical process, a fast-NMOS fast-PMOS process, a slow-NMOS slow-PMOS process, a fast-NMOS slow-PMOS process, and a slow-NMOS fast-PMOS process, are used as an embodiment. Among which, the value selection function includes six independent variables, namely, corner_number, parameter-value #1, parameter-value #2, parameter-value #3, parameter-value #4, and parameter-value #5. The first independent variable of the function is a keyword text of an independent variable, for example, the text of "corner_number"; the second independent variable, namely, parameter-value #1, is a device parameter value under a typical process corner condition (namely, TT); the third independent variable, namely, parameter-value #2, is a device parameter value under a fast-NMOS fast-PMOS process corner condition (namely, FF); the fourth independent variable, namely, parameter-value #3, is a device parameter value under a slow-NMOS slow-PMOS process corner condition (namely, SS); the fifth independent variable, namely, parameter-value #4, is a device parameter value under a fast-NMOS slow-PMOS process corner condition (namely, FNSP); and the sixth independent variable, namely, parameter-value #5, is a device parameter value under a slow-NMOS fast-PMOS process corner condition (namely, SNFP).

In order that a one-to-one mapping relationship between the independent variable of the process corner and the parameter values of the device model of the semiconductor process manufacturer line under the enumerated process corner conditions should be more intuitive, after the step (1) of the present invention, the parameter names and the parameter values of the process parameters in a device model file provided by the semiconductor process manufacturer under the process corner condition are substituted into the value selection function defined in the step (1) to generate a two-dimensional tabular function group in which a process corner condition corresponds to a parameter value of a process parameter of each device model under the process corner condition on a one-to-one basis. In the two-dimensional tabular function group, the natural number enumerating and representing process corners and parameter values of each device model under various process corner conditions, namely, the values to be selected of the function, are used as columns; they represent the independent variables of the value selection function; each device model parameter is used as a row of the table. The table is output as a text file in a specific print format by a conversion software tool, that is, a sweep simulation and value selection text file that can be read and interpreted directly by a simulator is formed, as shown in the following:

```
real corner_case ( real corner_number, real value_1, real value_2, real value_3, real value_4, real value_5) {
return((corner_number>4)?value_5:(corner_number >3)?value_4:(corner_number>2)?value_3: (corner_number>1)?
value_2:value_1)
}
//
// section
```

| parameters | | 1 | 2 | 3 | 4 | 5 | |
|---|---|---|---|---|---|---|---|
| + // *1.2V core NMOS | | TT | FF | SS | FNSP | SNFP | |
| +dtox | = corner_case (corner_number, | 0, | −1.0e−10, | 1.0e−10, | 0, | 0 | ) |
| +dxl | = corner_case (corner_number, | 0, | −1.0e−8, | 1.0e−8, | −1.00e−8, | 1.00e−8 | ) |
| +dxw | = corner_case (corner_number, | 0, | 2.2e−8, | −2.2e−8, | 1.8e−8, | −1.8e−8 | ) |
| +dvth | = corner_case (corner_number, | 0, | −0.04, | 0.045, | −0.04, | 0.045 | ) |
| +dcj | = corner_case (corner_number, | 0, | −4.8e−5, | 4.8e−5, | −4.8e−5, | 4.8e−5 | ) |
| +dcjsw | = corner_case (corner_number, | 0, | −3.9e−12, | 3.9e−12, | −3.9e−12, | 3.9e−12 | ) |
| +dcjswg | = corner_case (corner_number, | 0, | −2.0e−11, | 2.0e−11, | −2.0e−11, | 2.0e−11 | ) |
| +dcgdo | = corner_case (corner_number, | 0, | 1.8e−11, | −1.8e−11, | 0, | 0 | ) |
| +dcgso | = corner_case (corner_number, | 0, | 1.8e−11, | −1.8e−11, | 0, | 0 | ) |
| +dpvth0 | = corner_case (corner_number, | 0, | −3e−15, | 3e−15, | −3e−15, | 3e−15 | ) |

Figure 2:
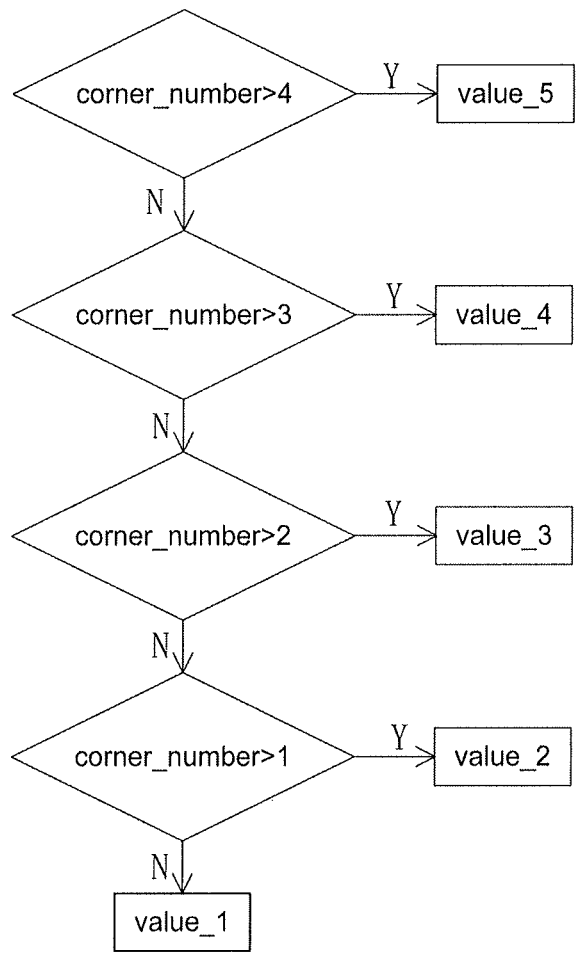
FIG. 2 is a block flowchart of the value selection function according to the present invention.

The first part of the file defines the value selection function. A keyword of "real" defines the data and variable type required by the Spectre language in this embodiment, that is, the type of the return value of a function called corner_case. The value of the first independent variable corner_number and values of other independent variables value_1, . . . , value_5 are all of a real number type. The return value of the corner_case function is output by a simple return command, while the return command includes a nested condition-and-selection statement. An operator "?" of the condition statement is used as a syntax keyword. The first condition of the nested condition- and selection-statement is whether corner_number is greater than the value of 4, that is, (corner_number>4)? If the result is logical true, according to the statement's syntax rule, the decision statement returns the value placed before the colon ":", namely, value_5. The return value of the condition-and-decision statement is returned by a return function, and is assigned as the return value of the corner_case function to a device model parameter on the left side of the equal sign. If the first condition statement result is logical false, according to the statement's syntax rule, the decision statement returns the value placed after the colon ":", which is the return value of the second-level nested condition-and-decision statement. In such a nested iteration manner, the value selection function accurately returns the parameter values corresponding to the process corner, which is ranged as corner_numbers 1, 2, . . . , 5. The condition-and-selection statement may be expressed by the flowchart shown in FIG. 2.

According to the syntax rule of Spectre simulator (for example), a text after a keyword "//" is a comment text, and is ignored by the simulator; and a context after a keyword "+" is a continuation line of a previous context line.

A second part of the file is a device model parameter list. Starting from a keyword of "parameters", the following context is a set of assignment statements, each of which is for each device model parameter. Each assignment statement calls a defined value selection function, for example, the corner_case function. Because the keyword "+" plays a role of a continuation, these value selection functions consisting of a set of assignment statements are arranged in a two-dimensional tabular style.

The text or table may be automatically generated by software, or obtained by performing text processing on the natural number that represents the process corner condition and the parameter value of each device model under the process corner condition, or directly obtained by manual collation. The two-dimensional tabular value selection function group is added to the simulation program, or more simply, a text line containing the two-dimensional tabular function group is invoked by an include statement line, that is, may be included in a simulation configuration file, and, by doing so, it is unnecessary to manually add a process parameter set part related to the process corners. The conversion processing is a one-off operation. For each set of process model libraries of a foundry, only one conversion operation needs to be performed, and a sweep simulation and value selection text file that may be used repeatedly may be obtained.

In the embodiment of the present invention, a method implemented by a software tool is used to automatically centralize different process corner model parameters provided by a foundry, and combine the parameters into a two-dimensional tabular function group, where each row in the table invokes a value selection function for a device model parameter. The left side of an equal sign of the function is a parameter of a device model, and the parameter has different values according to different process corners. The right side of the equal sign of the function calls a value selection function, one of the variables of the function is the process corner itself, and the return value is a parameter value corresponding to the current process corner.

Using the parameter, dtox, of a device model as an example, when corner_number is 1 (that is, a typical process TT), the return value of the function for the parameter is 0; when corner_number is 2 (that is, a fast-NMOS fast-PMOS process FF), the return value of the function for the parameter is −1.0e-10; when corner_number is 3 (that is, a slow-NMOS slow-PMOS process SS), the return value of the function for the parameter is 1.0e-10; when corner_number is 4 (that is, a fast-NMOS slow-PMOS process FNSP), the return value of the function for the parameter is 0; and when corner_number is 5 (that is, a slow-NMOS fast-PMOS process SNFP), the return value of the function for the parameter is 0.

For a complete description of the methodology, the variable corner_number may be assigned a value anytime like other common design variables. When it is unnecessary to sweep process corner parameters, a default parameter value may be selected for corner_number as a general setting, for example, set to 1, that is, under a prerequisite of no special setting, the typical process TT is selected for the default typical process case. For another example, when a series of simulation is performed on circuit performance under a slow-NMOS slow-PMOS process corner condition, the variable corner_number may be simply set to 3.

The present invention provides an implementation method using a Spectre simulator as an example. The method is universally applicable, and is not limited to the Spectre simulator.

A waveform chart using the variable corner_number as an independent variable and a parameter value of a device model under the process corner condition or a performance response value of a testbench circuit under the process corner condition as a dependent variable may be obtained by running a simulation program.

Figure 3:
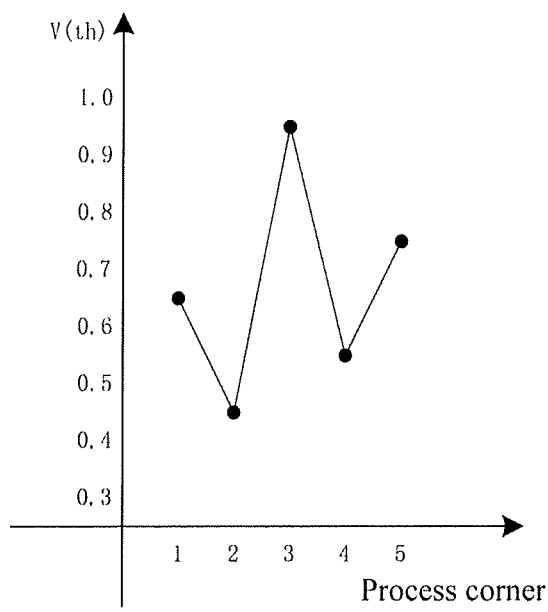
FIG. 3 is a waveform chart using a process corner as an independent variable and obtained by using a method for semiconductor process corner sweep simulation based on a value selection function according to the present invention.

FIG. 3 shows a waveform chart obtained by simulation using corner_number as an independent variable and using values of a threshold voltage of a MOS transistor under various process corner conditions as a dependent variable. From the waveform chart, it may be clearly seen that as the process corner changes, different values of the threshold voltage of the MOS transistor are shown. That is, when corner_number of the MOS transistor is 1 (that is, the typical process TT), the threshold voltage of the MOS transistor is 0.65V; when corner_number of the MOS transistor is 2 (that is, the fast-NMOS fast-PMOS process FF), the threshold voltage of the MOS transistor is 0.45V; when corner_number of the MOS transistor is 3 (that is, the slow-NMOS slow-PMOS process SS), the threshold voltage of the MOS transistor is 0.95V; when corner_number of the MOS transistor is 4 (that is, the fast-NMOS slow-PMOS process FNSP), the threshold voltage of the MOS transistor is 0.55V; and when corner_number of the MOS transistor is 5 (that is, the slow-NMOS fast-PMOS process SNFP), the threshold voltage of the MOS transistor is 0.75V. Because a sweep simulation manner using a process corner as an independent variable is implemented, a waveform chart using a parameter value of a device model under the process corner condition or a performance response value of a testbench circuit under the process corner condition as a dependent variable may be obtained directly by simulation. In the prior art, if the waveform chart using a process corner as an independent variable is needed, it is necessary to first manually set the first process corner condition, then run a simulation program, and after the simulation is complete, export a waveform chart, then manually set the second process corner condition, run the simulation program again, export an obtained waveform chart, and then run the simulation program before manually setting the third process corner condition. After such operations are repeated for five times, five waveform charts are obtained. Then a coordinate system is set up, and the five waveform charts are superposed into the coordinate system. Points are selected from each waveform, and then a coordinate system using a process corner as an independent variable is set up. The points selected from each waveform chart are plotted in the new coordinate system, and thereby a waveform chart using a process corner as an independent variable and the parameter value of a device model under the process corner condition or a performance response value of a testbench circuit under the process corner condition as a dependent variable is obtained. This is a very complicated and time consuming process. Even if the method of the OCEAN script is used, and process corners are automatically switched during simulation, it is still necessary to perform simulation for five times on the five different process corners to be switched, and then perform superposition, point selection, and plotting operations. The simulation procedure cannot be simplified ultimately.

The present invention implements a sweep simulation method in which process corners are continuously swept in a simulation job, and a process corner is used as an independent variable, so that a simulation program outputs a waveform chart using parameter values of a device model under various process corner conditions or performance response values of a testbench circuit under various process corner conditions as a dependent variable. Thereby, process parameter value deviations of the device model or performance response value of the testbench circuit under various process corner conditions are presented in a same coordinate system, thus visual technical references are provided for a designer, and process deviations are properly taken into account in the circuit design. As a benefit, possible fatal defects of the circuit caused by a process deviation impact are avoided, and a processing procedure of the simulation program is greatly simplified, and research and development efficiency of the designer is much improved.

What is claimed is:

1. A method for semiconductor process corner sweep simulation based on a value selection function, the method comprising the following steps:
   (1) defining a value selection function, wherein in the value selection function, a corner number, which is a natural number enumeration and representing a process corner of a device model, is used as a first independent variable, parameter values of the device model of a semiconductor process manufacturer line under enumerated process corner conditions are used as the rest of independent variables, and device model parameters of the device model of the semiconductor process manufacturer line under the enumerated process corner conditions are function values to be returned that is expressed by an equation given below:

device model parameter=$f$(corner-number,parameter-value #1,parameter-value #2, . . . ,parameter-value #$n$), wherein, the function "f" on the right side of the equation is the value selection function, and a return value of the value selection function, upon a selection operation is performed according to a value of the first independent variable, is obtained and assigned to a device model parameter on the left side of the equation via an equal sign;
   (2) setting up the first independent variable, namely corner_number in the value selection function, as a user-defined design variable in a sweep simulation program, and running the sweep simulation program while sweeping the corner_number in semiconductor process corner sweep simulation one by one for values within a predefined range of natural numbers; and
   (3) outputting a waveform chart using simulation results of the semiconductor process corner sweep simulation by utilizing corner_number as an independent variable and a parameter value of the device model under a process corner condition or a performance response value of a testbench circuit under a condition using the process corner condition as a dependent variable.

2. The method for semiconductor process corner sweep simulation based on a value selection function according to claim 1, wherein after the step (1), all device parameter names and parameter values related to the process corner in a device model file provided by the semiconductor process manufacturer line are respectively substituted into the value selection function defined in the equation given in the step (1) to form a two-dimensional tabular value selection function group.

3. The method for semiconductor process corner sweep simulation based on a value selection function according to claim 1, wherein the first independent variable of the value selection function is a parameter keyword of an independent variable.

4. The method for semiconductor process corner sweep simulation based on a value selection function according to claim 1, wherein the other independent variables of the value selection function are parameter-value #1, parameter-value #2, parameter-value #3, parameter-value #4, and parameter-value #5, wherein the second independent variable, namely parameter-value #1, is a device parameter value under a typical process corner condition, the third independent variable, namely parameter-value #2, is a device parameter value under a fast-NMOS fast-PMOS process corner condition, the fourth independent variable, namely parameter-value #3, is a device parameter value under a slow-NMOS slow-PMOS process corner condition, the fourth independent variable, namely parameter-value #4, is a device parameter value under a fast-NMOS slow-PMOS process corner condition, and the sixth independent variable, namely parameter-value #5, is a device parameter value under a slow-NMOS fast-PMOS process corner condition.

* * * * *